(12) United States Patent
Magee

(10) Patent No.: US 11,249,512 B2
(45) Date of Patent: *Feb. 15, 2022

(54) FREQUENCY EXECUTION MONITORING IN A REAL-TIME EMBEDDED SYSTEM

(71) Applicant: TEXAS INSTRUMENTS INCORPORATED, Dallas, TX (US)

(72) Inventor: David P. Magee, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 3 days.

This patent is subject to a terminal disclaimer.

(21) Appl. No.: 16/525,185

(22) Filed: Jul. 29, 2019

(65) Prior Publication Data

US 2019/0354135 A1 Nov. 21, 2019

Related U.S. Application Data

(63) Continuation of application No. 14/272,120, filed on May 7, 2014, now Pat. No. 10,365,683.

(60) Provisional application No. 61/821,917, filed on May 10, 2013.

(51) Int. Cl.
| | | |
|---|---|---|
| *G06F 1/14* | (2006.01) | |
| *G06F 11/34* | (2006.01) | |
| *G06F 1/08* | (2006.01) | |
| *G06F 11/07* | (2006.01) | |
| *G06F 1/06* | (2006.01) | |
| *G01R 23/00* | (2006.01) | |
| *H03K 5/19* | (2006.01) | |
| *G06F 15/78* | (2006.01) | |

(52) U.S. Cl.
CPC .............. *G06F 1/14* (2013.01); *G01R 23/005* (2013.01); *G06F 1/06* (2013.01); *G06F 1/08* (2013.01); *G06F 11/076* (2013.01); *G06F 11/0751* (2013.01); *G06F 11/0754* (2013.01); *G06F 11/0757* (2013.01); *G06F 11/0772* (2013.01); *G06F 11/3419* (2013.01); *G06F 11/3423* (2013.01); *G06F 15/7814* (2013.01); *H03K 5/19* (2013.01)

(58) Field of Classification Search
CPC ....................................................... G06F 1/14
See application file for complete search history.

(56) References Cited

U.S. PATENT DOCUMENTS

| | | | | |
|---|---|---|---|---|
| 6,496,848 B1 * | 12/2002 | Nankaku | ............ | G05B 19/4155 718/100 |
| 9,128,720 B2 * | 9/2015 | Michalak | .............. | G06F 1/3296 |
| 2002/0184568 A1 | 12/2002 | Kurrasch | | |

(Continued)

*Primary Examiner* — Phil K Nguyen

(74) *Attorney, Agent, or Firm* — Michael T. Gabrik; Charles A. Brill; Frank D. Cimino

(57) ABSTRACT

A method includes reading first and second timer count values from a timer. The first timer count value is associated with a first time point, and the second timer count value is associated with a second time point. Also, the method includes calculating a difference between the first and the second timer count values, and determining whether the difference is within a range. The range is based on a desired executing frequency to perform a computing task, a variation of the desired executing frequency, and a timer frequency. Further, based on the difference not being within the range, the method includes setting an error flag value to be true and incrementing an error count value.

6 Claims, 2 Drawing Sheets

(56) References Cited

U.S. PATENT DOCUMENTS

| | | |
|---|---|---|
| 2004/0153886 A1 | 8/2004 | Schumacher et al. |
| 2008/0152065 A1 | 6/2008 | Okumura et al. |
| 2008/0155321 A1* | 6/2008 | Riedlinger ............ G06F 1/3296 714/17 |
| 2009/0300435 A1 | 12/2009 | Karner et al. |
| 2010/0275053 A1* | 10/2010 | Salam ....................... G06F 1/10 713/503 |
| 2014/0053161 A1* | 2/2014 | Sadowski ............. G06F 9/4887 718/102 |
| 2014/0108850 A1 | 4/2014 | Simolon et al. |
| 2014/0136907 A1 | 5/2014 | Guthridge |
| 2014/0232434 A1 | 8/2014 | Koazechi et al. |

* cited by examiner

FREQUENCY EXECUTION MONITORING IN A REAL-TIME EMBEDDED SYSTEM

CROSS-REFERENCE TO RELATED APPLICATIONS

This application is a continuation of U.S. patent application Ser. No. 14/272,120 filed May 7, 2014, which claims priority to U.S. Provisional Patent Application Ser. No. 61/821,917 filed May 10, 2013, the entireties of both of which are incorporated herein by reference.

BACKGROUND

A real-time operating system is a computing environment that reacts to input to perform a task within a specific time period. Each task to be performed in the operating system may be executed at a predetermined rate.

SUMMARY

Systems and methods to monitor an execution frequency of a task are described herein. In an embodiment, a method includes reading first and second timer count values from a timer, wherein the first timer count value is associated with a first time point and the second timer count value is associated with a second time point, calculating a difference between the first and the second timer count values, and determining whether the difference is within a range, wherein the range is based on a desired executing frequency to perform a computing task, a variation of the desired executing frequency, and a timer frequency. Further, based on the difference not being within the range, the method includes setting an error flag value to be true and incrementing an error count value.

In another embodiment, a system includes a timer and a processing resource coupled to the timer. The timer is configured to generate a plurality of timer count values that are a time series of values with a period of an inverse value of a timer frequency. The processing resource is configured to read first and second timer count values from the timer, calculate a difference between the first and the second timer count values, and determine whether the difference is within a range, wherein the range is based on a desired executing frequency to perform, by the processor, a computing task, a variation of the desired executing frequency, and the timer frequency. More particularly, based on the difference not being within the range, the processing resource is further configured to set an error flag value to be true and increment an error count.

In a further embodiment, a non-transitory, computer-readable storage device containing instructions that, when executed by a processing resource, cause the processing resource to read first and second timer count values from a timer, calculate a difference between the first and the second timer count values, determine whether the difference is within a range, wherein the range is based on a desired executing frequency to perform, by the processor, a computing task, a variation of the desired executing frequency, and the timer frequency. Based on the determined difference, if the difference is not within the range, the processing resource executes the instructions to cause the processing resource to set an error flag value to be true and increment an error count; on the other hand, if the difference is within the range, the processing resource executes the instructions to cause the processing resource to set the error flag value to be false.

DETAILED DESCRIPTION OF EXAMPLE EMBODIMENTS

Figure 1:
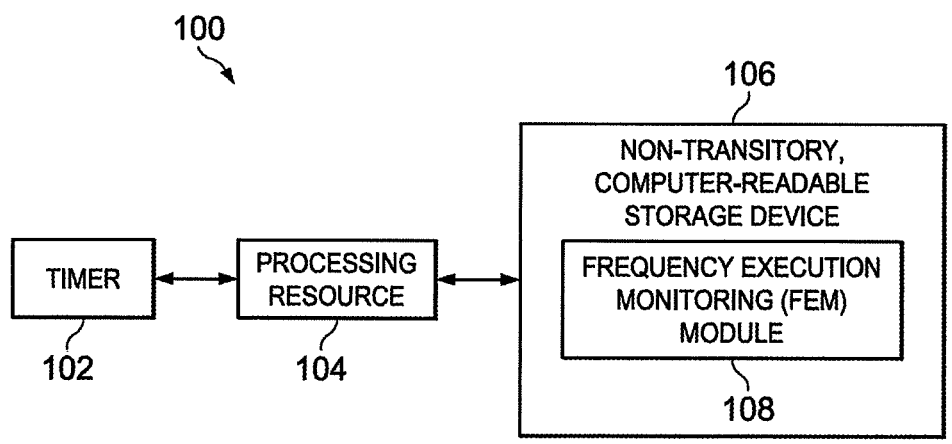
FIG. 1 shows a system to monitor frequency execution in accordance with various embodiments.

In this description, the term "couple" or "couples" means either an indirect or direct connection. Thus, if a first device couples to a second device, that connection may be through a direct connection, or through an indirect connection via other devices and connections.

An operating system is configured to manage hardware resources of a computing device and host applications that run on the computing device. More specifically, a real-time operating system (RTOS) is an operating system designated to perform tasks (e.g., host applications) with very precise timing and a high degree of reliability. Such characteristics of the RTOS may be advantageously implemented in measurement and automation systems wherein, for example, downtime of the system is costly or a safety hazard may be caused due to a delay of executing a particular task.

By "real-time", it is meant that an operating system may include a predetermined maximum amount of time for each of tasks that the operating system performs, or include a consistent level regarding the amount of time the operating system takes to accept and complete each of the tasks. As such, the RTOS is commonly used to perform multitasking. Multitasking is a method in which multiple tasks are performed during the same period of time. Generally, for a system implementing a RTOS for multitasking, the system may use certain algorithms or methods to schedule each task, such as preemptive priority and/or round robin scheduling. Regardless of which scheduling method is used, assuring a task is performed or executed at a predetermined rate, or at least within an acceptable range of rates is beneficial to the successful performance of the system.

To assure a task is executed at a predetermined rate, described embodiments provide systems and methods to monitor an execution frequency of a task in an RTOS. Generally, the execution frequency is a frequency for a task to be executed, and the execution frequency may be designated by a user. More specifically, the execution frequency, or execution time, may be referred to as time spent by a processor to perform the task. For example, a user may designate a particular task to be executed by a processor every five second. Such designation of the execution frequency may advantageously provide a precise timing to produce correct results that the user originally desires. However, conventionally, the user who designates the execution frequency of a task is incapable of knowing whether the task is being executed at the desired frequency.

Using the described systems and methods, a user may monitor the execution frequency for each task and the user may be informed of an error when a particular task is not executed within a predetermined or an acceptable range of execution frequency (i.e., rate). Once the error is received by the user, the user may take further action in any suitable purposes. For example, the user may tailor an instruction to execute the particular task accordingly so as to cause the task to be executed at a desired rate. Thus, the described embodiments may advantageously provide a more efficient way to implement the RTOS with a precise timing for scheduling each of the tasks among a multitasking system, and in turn, enhance the performance of the system. Generally, the term "task" is a programmed instruction which is synonymous to a "thread", or a "process".

FIG. 1 shows a system 100 to monitor the execution frequency in accordance with various embodiments. The system 100 includes a timer 102, a non-transitory, computer-readable storage device 106, and a processing resource 104 coupled to the timer 102 and the non-transitory, computer-readable storage device 106. More particularly, the non-transitory, computer-readable storage device 106 includes a frequency execution monitoring (FEM) module 108 which is executed by the processing resource 104.

In FIG. 1, the timer 102 is configured to measure elapsed time, for example by counting timer count values provided to the processing resource 104. Preferably, the timer count values are a time series of values with a period, and the processing resource 104 is configured to read the timer count values. By knowing a value of the period and any two timer count values at the beginning and end of executing a task, time spent by the processing resource 104 to finish the task may be provided. Details of a relation between the spent time and the period will be explained with respect to the exemplary signal generated by the timer 102 in FIG. 2. In general, the period is defined as an inverse value of a timer frequency $f_t$. In a preferred embodiment, if the timer 102 is an incrementing timer, the timer 102 increments the timer count value for each transition of an input clock signal provided to the timer 102. Analogously, if the timer 102 is a decrementing timer, the timer 102 decrements the timer count value for each transition of the input clock signal. Details of the timer count values will be described with respect to FIG. 2.

Still referring to FIG. 1, in accordance with various embodiments, the processing resource 104 may include one or more processors, wherein each of the processors may include a single-core central processing unit (CPU) or a multi-core CPU. Additionally or alternatively, the computing resource 104 may be implemented as a computer or a computer cluster. For ease of illustration, the following discussion is based on the computing resource 104 including a single-core CPU.

The system 100 preferably is a real-time embedded system. An embedded system is an electronic system with a dedicated function within a larger mechanical or electrical system, and the embedded system is commonly embedded as part of a complete device often including hardware and mechanical components.

Figure 2:
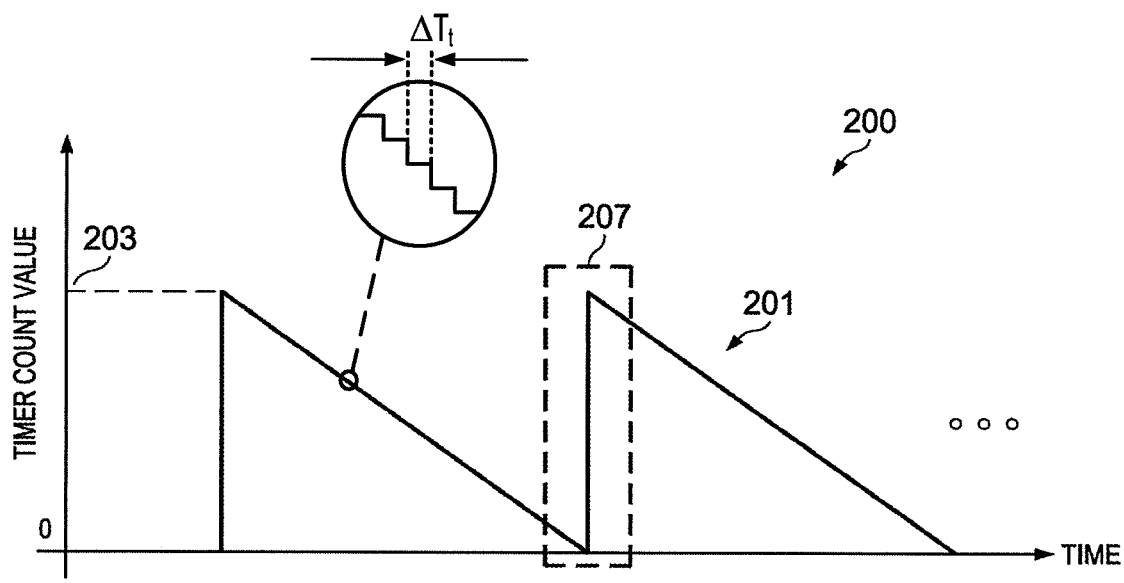
FIG. 2 show an exemplary signal of a time-varying timer count value in accordance with various embodiments.

FIG. 2 shows an exemplary signal 201 of timer count values generated by the timer 102 in accordance with various embodiments. As shown in FIG. 2, the signal 201 includes a time series of values with a period. The signal 201 shown in FIG. 2 is generated by a decrementing timer, or a count-down timer. As such, the signal 201 typically starts with a starting timer count value (e.g., 203), and transitions to zero as the timer counts down over the timer period. In other embodiments, the timer 102 is an incrementing timer, and if a signal is generated by an incrementing timer, the signal may start at a zero value and count up to a final value. As indicated above, the timer frequency, $f_t$, is as the inverse value of the timer period, referred to as the timer count interval $\Delta T_t$.

Further, in accordance with a preferred embodiment, as described above, a task in a system implementing the multitasking is generally executed at a desired frequency which may be predetermined by a user. The desired frequency is generally referred as execution frequency, $f_e$. An inverse value of the desired execution frequency reflects the desired or target time between executions of the task and is referred to herein as the desired execution time ($T_e$). Depending on the performance of the system, the desired execution time, $T_e$, may be different from the amount of time, in practice, the processing resource spends finishing the task. Conventionally, no systems or methods have been provided to monitor the exact time spent by a processor to finish a task.

However, with these two frequencies (i.e., $f_t$ and $f_e$), a method may be developed to monitor the execution frequency of a task executed by the system 100. In a preferred embodiment, a tolerable execution frequency variation may be determined by the user to be, $\Delta f_e$. As such, an allowable range of time for executing a task may be defined as equation (1), $$\frac{1}{f_e + \Delta f_e} \leq \Delta T \leq \frac{1}{f_e - \Delta f_e}. \tag{1}$$

More particularly, if an amount of time between task executions does not reside within the allowable range, the execution may be regarded as an error. Hereinafter, the amount of time between task executions of the task of interest, $\Delta T$, is referred to as the execution time of the task.

Equation (2) below may be derived from equation (1). The equation (2) is shown as, $$\frac{f_t}{f_e + \Delta f_e} \leq \frac{\Delta T}{\Delta T_t} \leq \frac{f_t}{f_e - \Delta f_e} \tag{2}$$

where $\Delta T_t$ is the timer count interval, and $f_t$ is the inverse value of the timer count interval, that is, the timer frequency.

The execution time can be measured by the timer 102, so that the execution time $\Delta T$ may be expressed for a decrementing timer as equation (3) shown below, $$\Delta T = (cnt_n - cnt_{n+1}) \cdot \Delta T_t \tag{3}$$

where $cnt_n$ is the timer count value for the $n^{th}$ iteration of the task being executed, and analogously, $cnt_{n+1}$ is the timer count value for the $(n+1)^{th}$ iteration of the task being executed. Typically, the $n^{th}$ iteration is associated with a first value of time and the $(n+1)^{th}$ iteration is associated with a second value of time successively to the first value of time. If the timer 102 is a decrementing timer, the difference between $cnt_n$ and $cnt_{n+1}$ (i.e., $cnt_n - cnt_{n+1}$) is positive; in order to maintain the difference to be a positive value, the difference may be expressed as, $cnt_{n+1} - cnt_n$, for an incrementing timer. Replacing the term $$\frac{\Delta T}{\Delta T_t}$$

in equation (2) may result in a new equation for the allowable execution time, which is shown as equation (4), $$\frac{f_t}{f_e + \Delta f_e} \le (cnt_{n+1} - cnt_n) \le \frac{f_t}{f_e - \Delta f_e} \quad (4)$$

In a further embodiment, the lower bound of the equation (4) may be simplified as $\Delta cnt_{min}$, wherein $\Delta cnt_{min}$ may be referred to as a minimum allowable counter difference. Similarly, the upper bound may also be simplified as $\Delta cnt_{max}$, wherein $\Delta cnt_{max}$ may be referred to as a maximum allowable counter difference. Thus, the equation is simplified as $$\Delta cnt_{min} \le \Delta cnt \le \Delta cnt_{max}, \quad (5).$$

By using equation (5), whether a task is executed at a rate (frequency) within an allowable range can be determined. More particularly, since the lower bound and the higher bound in the equation (5) are based on parameters ($f_t$, $f_e$, and $\Delta f_e$) predetermined by the user, reading two successive timer count values from the timer 102 may cause the processing resource 104 to determine whether the task is executed at an allowable frequency.

Also, in some embodiments, the processing resource 104 may be capable of detecting a transition (e.g., 207) while reading the timer count value from the timer 102. The transition (e.g., 207) occurs when a first timer count interval elapses and a successive second timer count initiates. Once the transition is detected by the processing resource 104, the processing resource 104 may add the starting value (e.g., 203) to the execution time difference (i.e., $\Delta cnt$) to avoid causing a singularity while implementing the described method to monitor the execution frequency.

Figure 3:
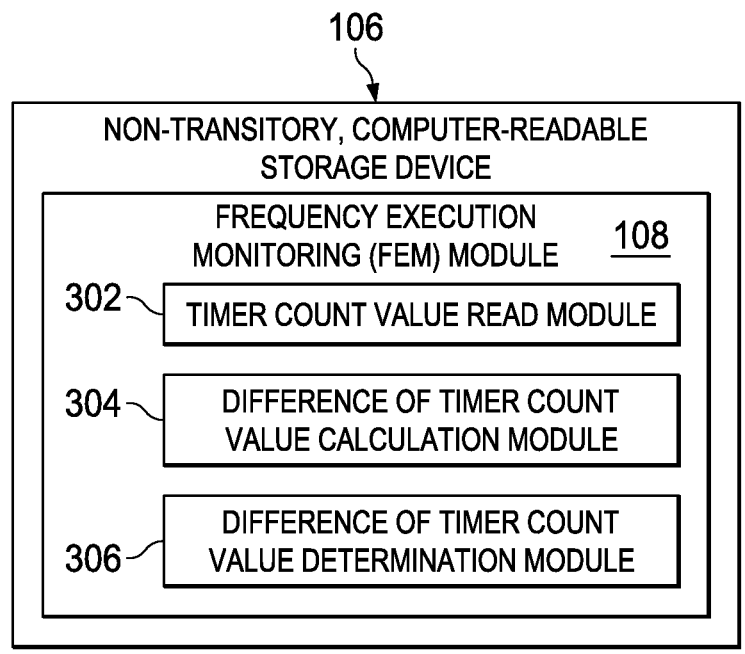
FIG. 3 shows an example of a frequency execution monitoring module in accordance with various embodiments.

FIG. 3 shows a block diagram to further illustrate the non-transitory, computer-readable storage device 106 in accordance with various embodiments. The storage device 106 includes a variety of modules that can be executed by the processing resource 104 to perform any or all of the functionality described herein.

As shown in the example of FIG. 3, the FEM module 108 includes three modules which may include a timer count value read module 302, a difference of timer count value calculation module 304, and a difference of timer count value determination module 306. Each module of FIG. 3 is executed by the processing resource 104 to implement the functionality described herein. The functions to be implemented by executing the modules 302, 304, and 306 will be described with reference to the flow diagram of FIG. 4. The combination of the computing resource 104 executing a particular module represents an "engine." Thus, the processing resource executing the various modules implements a timer count value read engine, a difference of timer count value calculation engine, and a difference of timer count value determination engine.

Figure 4:
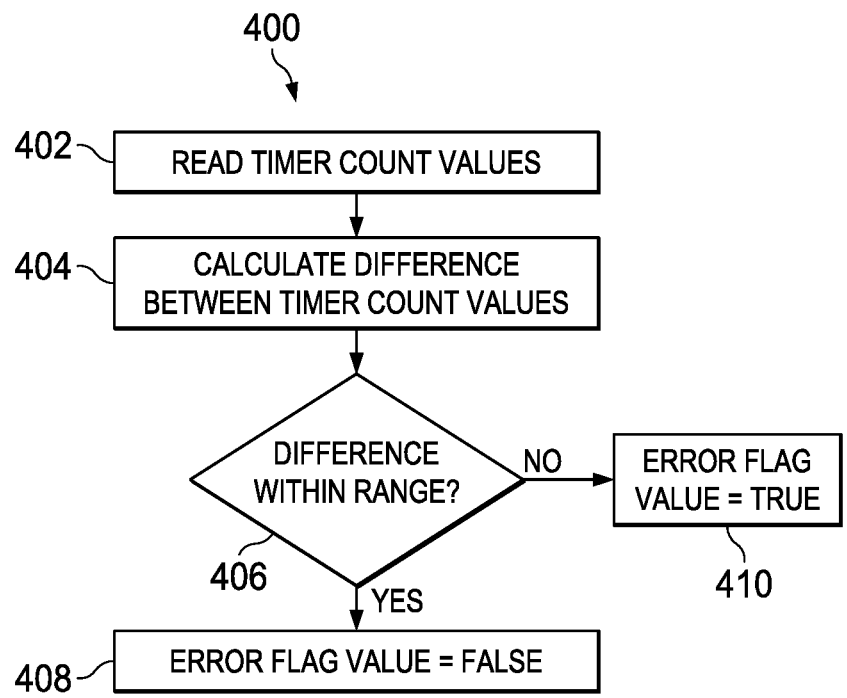
FIG. 4 shows a method to monitor a frequency execution in accordance with various embodiments.

FIG. 4 shows a flow diagram 400 to explain the implementation of the frequency execution monitoring (FEM) module 108 in accordance with various embodiments. The flow diagram starts with block 402, by executing the timer count value read module 302, to read a first and a second timer count values, wherein the first timer count value is associated with a first iteration of the task being executed and the second timer count value is associated with a second iteration. In a preferred embodiment, the second iteration is successive in time to the first iteration.

As a result of executing the difference of timer count value calculation module 304, the flow diagram 400 routes to block 404 to calculate a difference (i.e., $\Delta cnt$) between the first and the second timer count values. In a preferred embodiment, if the timer 102 is a decrementing timer, the difference is calculated as the first timer count value minus the second timer count value. Once the difference has been calculated at block 404, the flow diagram may route to block 406. At block 406, the difference of timer count value determination module 306 is executed to determine whether the difference is within the allowable range of execution time, based on the equation (5).

Still referring to the flow diagram 400, if the difference is within the range, the flow diagram 400 routes to block 408 to set an error flag value to be false. However, if the difference is not within the range, the flow diagram 400 routes to block 410 to set the error flag value to be true.

Modifications are possible in the described embodiments, and other embodiments are possible, within the scope of the claims.

What is claimed is:

1. A system comprising:
  a storage device containing executable instructions to monitor a frequency at which a task of a real time operating system is performed; and
  a processing resource coupled to the storage device to execute the executable instructions to:
    determine a first time associated with a first execution of the task and determine a second time associated with a second execution of the task;
    calculate a time difference between the first time and the second time;
    determine whether the time difference is in a fixed range;
    set an error flag to be true when the time difference is not within the fixed range or set the error flag to be false when the time difference is within the fixed range; and
  a timer coupled to the processing resource, wherein the timer is configured to count pulses of a clock signal and to generate output count values from which the first and second times are determined.

2. The system of claim 1, wherein the processing resource is at least one of: (a) a single core central processing unit (CPU), (b) a multi-core CPU, or (c) a computer cluster.

3. The system of claim 1, wherein the timer is a decrementing timer that counts down from a maximum count value to a minimum count value, and when the timer reaches the minimum count value, the timer transitions to the maximum count value.

4. A system comprising:
  a timer configured to count transitions of a clock signal;
  a storage device containing executable instructions;
  a processing resource coupled to the timer and to the storage device to execute the executable instructions to:
    determine a value representing one of (i) a ratio of a time to execute a task of a real time operating system to a count interval of the timer, or (ii) a product of a time to execute the task and the frequency of the timer;
    determine whether the value is within a fixed range determined based on a frequency of the timer, an execution frequency of the task, and an allowable execution frequency; and
    set an error flag to be true when the ratio is not within the fixed range or set the error flag to be false when the ratio is within the fixed range.

5. The system of claim 4, wherein the processing resource is at least one of: (a) a single core central processing unit (CPU), (b) a multi-core CPU, or (c) a computer cluster.

6. A method comprising:
  determining, by a processing resource, a first time associated with a first execution of a task of a real time operating system and a second time associated with a second execution of the task;
  calculating a time difference between the first time and the second time;
  determining whether the time difference is in a fixed range;
  setting an error flag to be true when the time difference is not within the fixed range or setting the error flag to be false when the time difference is within the fixed range; and
  counting pulses of a clock signal and to generate output count values from which the first and second times are determined.

* * * * *